United States Patent [19]

Raymond, Jr.

[11] 4,209,716
[45] Jun. 24, 1980

[54] SEMICONDUCTOR INTEGRATED CIRCUIT WITH IMPLANTED RESISTOR ELEMENT IN SECOND-LEVEL POLYCRYSTALLINE SILICON LAYER

[75] Inventor: Joseph H. Raymond, Jr., Katy, Tex.

[73] Assignee: Texas Instruments Incorporated, Dallas, Tex.

[21] Appl. No.: 801,699

[22] Filed: May 31, 1977

[51] Int. Cl.[2] .................. H01L 29/04; H01L 29/78; H01L 23/48
[52] U.S. Cl. .................................. 357/59; 357/23; 357/71; 307/303; 307/238
[58] Field of Search ................ 357/23, 59, 68, 71, 357/238; 307/303

[56] References Cited

U.S. PATENT DOCUMENTS

| | | | |
|---|---|---|---|
| T964,009 | 11/1977 | Chiu et al. | 357/59 |
| 3,519,901 | 7/1970 | Bean et al. | 357/59 |
| 3,576,478 | 4/1971 | Watkins | 357/59 |
| 3,667,008 | 5/1972 | Katnack | 357/59 |
| 3,792,384 | 2/1974 | Hunt | 357/59 |
| 3,902,188 | 8/1975 | Jacobson | 357/68 |
| 3,936,865 | 2/1976 | Robinson | 357/68 |
| 4,041,518 | 8/1977 | Shimizu et al. | 357/23 |
| 4,055,444 | 10/1977 | Rao | 357/23 |
| 4,070,653 | 1/1978 | Rao et al. | 357/51 |
| 4,110,776 | 8/1978 | Rao et al. | 357/51 |
| 4,112,509 | 9/1978 | Wall | 357/23 |
| 4,131,906 | 12/1978 | Kinoshita | 357/51 |

Primary Examiner—Andrew James
Attorney, Agent, or Firm—John G. Graham

[57] ABSTRACT

Integrated circuit resistor elements ideally suited for load devices in static MOS RAM cells are made in second-level polycrystalline silicon by an ion implant step compatible with a self-aligned N-channel silicon-gate process. The cell size is reduced as the resistors can overly the first-level poly or MOS transistors. The second-level poly does not form transistor gates, so it is less critical, and an efficient layout provides a very small cell area.

16 Claims, 14 Drawing Figures

SEMICONDUCTOR INTEGRATED CIRCUIT WITH IMPLANTED RESISTOR ELEMENT IN SECOND-LEVEL POLYCRYSTALLINE SILICON LAYER

BACKGROUND OF THE INVENTION

This invention is directed to semiconductor devices and methods of making such device, and more particularly to an improved resistor element in MOS integrated circuits.

In early semiconductor integrated circuits, resistors were provided by diffused regions or by portions of the semiconductor substrate which were defined by etching, as seen in U.S. Pat. No. 3,138,743 issued to Jack S. Kilby and assigned to Texas Instruments. As the density of components in integrated circuits grew, the area occupied by resistors became prohibitive, so logic forms were favored which used few resistors or no resistors. For example, "TTL" or transistor-transistor logic and $I^2L$ or integrated injection logic in bipolar technology had features minimizing the area on a bar dedicated to resistors. In MOS logic and memories, transistors are used as load devices or in effect as resistors. Examples of very complex MOS circuits containing many thousands of transistors but no resistors in a single chip digital processor or memory are shown in U.S. Pat. No. 3,940,747, issued to Kuo and Kitagawa and U.S. Pat. No. 3,998,604, issued to J. H. Raymond, Jr., both assigned to Texas Instruments.

High density MOS memory devices such as the 4096 bit memory described in U.S. Pat. No. 3,940,747. or the "16K" or 16384 bit memory described in pending application Ser. No. 682,687, filed May 3,1976 by N. Kitagawa, have been of the dynamic type because dynamic one-transistor cells are the smallest in area.

In some parts of digital equipment, however, the refresh circuitry required for dynamic memories is incompatible or undesirable, so static memory is perferred. Static cells traditionally employ six-transistor bistable circuits wherein depletion-load MOS transistors are used as load devices. These cells are much larger than the one-transistor cells of dynamic memory devices, so the density is less. Also, power dissipation is high due to the requirement that some current must flow through one side of each cell in the array to maintain the stored data.

In copending application Ser. No. 691,252, filed May 28, 1976 by G. R. Mohan Rao, assigned to Texas Instruments, there is disclosed a resistor element particularly for a static RAM cell wherein the resistors are implanted regions buried beneath field oxide. In application Ser. No. 727,116 filed Sept. 27, 1976 by Rao, Stanczak, Lien and Bhatia, assigned to Texas Instruments, a static cell using implanted resistors in polycrystalline silicon over field oxide is described. While these inventions represent marked improvements, further reduction in cell size is needed for arrays of the 16K or larger size.

It is a principal object of this invention to provide improved resistor elements in integrated circuits. Another object is to provide an improved small area static RAM cell for MOS memory devices of high density. An additional object is to provide small area, high resistance load elements for transistors in semiconductor integrated circuits.

SUMMARY OF THE INVENTION

In accordance with the invention, a resistor element is provided in an N-channel, silicon-gate MOS integrated circuit by an ion-implanted area in a strip of second level polycrystalline silicon which may extend over other elements, such as transistors. The resistor area is doped at a much lower level than the remaining areas of the second-level polycrystalline silicon which are highly conductive. Double-level poly memory devices have been previously used, as seen in the copending applications of C-K Kuo, Ser. No. 648,594, filed Jan. 12,1976, and Ser. No. 722,841, filed Sep. 13, 1976, both assigned to Texas Instruments. However, the increase in component density provided by the overlying structures of this invention have not been available. For example, the positive supply line can overly the ground line, neither requiring contact areas in this invention, and the cell may be duplicated in an array in a manner to share contact areas and conductors.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
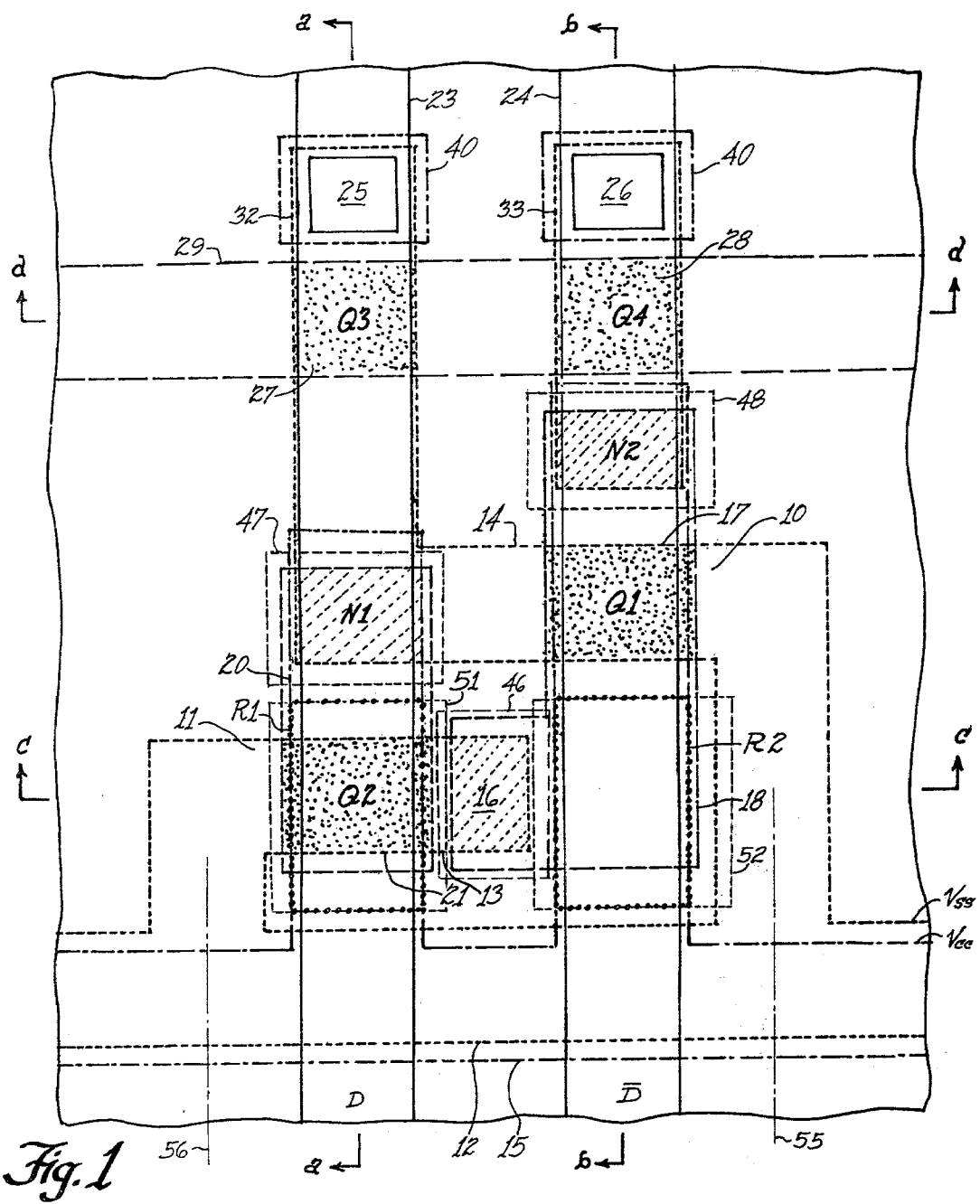
FIG. 1 is a greatly enlarged plan view of a small portion of a semiconductor chip showing the physical layout of a static RAM cell using the features of the invention.

Referring to FIG. 1, a physical layout is shown of an N-channel silicon gate MOS static RAM cell which utilizes the features of the invention. This cell is of course greatly enlarged in FIG. 1, as it would actually occupy only about 1.5 to 2.0 square mils, i.e., the larger dimension of the cell of FIG. 1 would be less than about two mils. The cell is also shown in FIG. 2 as an electrical schematic diagram, with the parts numbered the same as FIG. 1.

Figure 2:
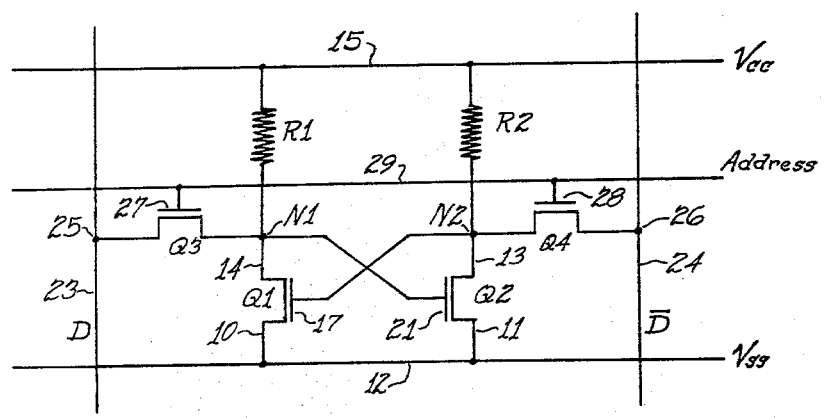
FIG. 2 is an electrical schematic diagram of the cell of FIG. 1.

The cell of FIGS. 1 and 2 consists of a pair of cross-coupled driver transistors Q1 and Q2, each of which has a source 10 or 11 in the form of an N+ region connected to an elongated N+ diffused strip which is a ground or Vss line 12. Each transistor has an N+ drain region 13 or 14 which is electrically connected via nodes N1 and N2 to a Vcc or positive supply line 15 through a resistor R1 or R2. The resistors R1 and R2 are formed by ion implantation in a second-level polycrystalline silicon layer according to a feature of this embodiment of the invention. The Vcc supply line 15 is an elongated heavily doped region of the second-level poly. A node or contact area 16 at the drain 13 of the transistor Q2 is connected to a first level polysilicon strip which forms the gate 17 of the transistor Q1 and the node N2 in one polysilicon conductor 18. In like manner a first-level polysilicon conductor 20 connects the poly gate 21 of the transistor Q2 to the node N1 at the drain 14 of the transistor Q1, providing the cross-coupling connection of a bistable or flip-flop circuit. Metal strips which provide data lines 23 and 24 (usually referred to D and $\bar{D}$, or as D0 and D1) are connected to the nodes N1 and N2 via coupling transistors Q3 and Q4 and metal-to-moat contacts 25 and 26 which include a second-level poly layer according to a feature of one embodiment. The gates 27 and 28 of the transistors Q3 and Q4 are connected to (actually part of) a word address line 29 which is a first-level polysilicon strip.

Referring to FIGS. 3a–3d, sectional views of the cell of FIG. 1 show the details of construction. The cell is a small part of a substrate 30 of P-type silicon. The transistors Q1, Q2, Q3 and Q4 are formed in elongated moat regions in which N+ diffused regions 10, 11, 12, 13 and 14 create the Vss line and source and drain regions for the transistors. Also, N+ regions 32 and 33 in the moats form the lower part of the metal-to-moat contacts 25 and 26. A thin silicon oxide gate dielectric layer 34 and phosphorus-doped first-level polysilicon areas 17, 18, 20, 21, 27, 28 and 29 form the gates of the transistors, the interconnects, and the address line. The polysilicon strips which form the gates 17 and 21 are parts of the elongated strips which include the cross-coupling interconnects. Thick field oxide 35 exists at all areas where moats including N+ diffused regions or transistors do not exist, and a P+ boron-doped channel-stop region 36 is created under all areas of the field oxide 35. An insulating layer 37 is formed over the entire top surface, overlying the polysilicon, the field oxide 39, and the N+ regions. The lines 23 and 24 are metal strips overlying this insulating layer 37.

Figure 3A:
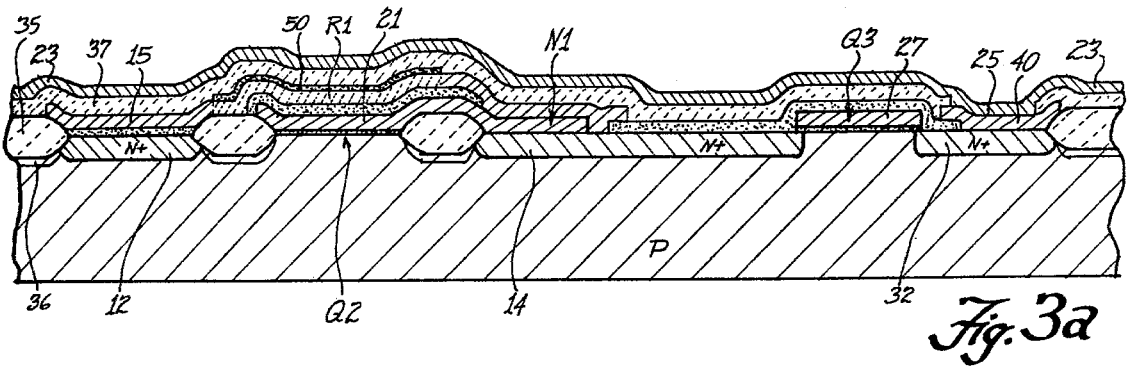
FIGS. 3a–3d are elevation views in section of the cell of FIG. 1, taken along the lines a—a, b—b, c—c and d—d, respectively.
Figure 3B:
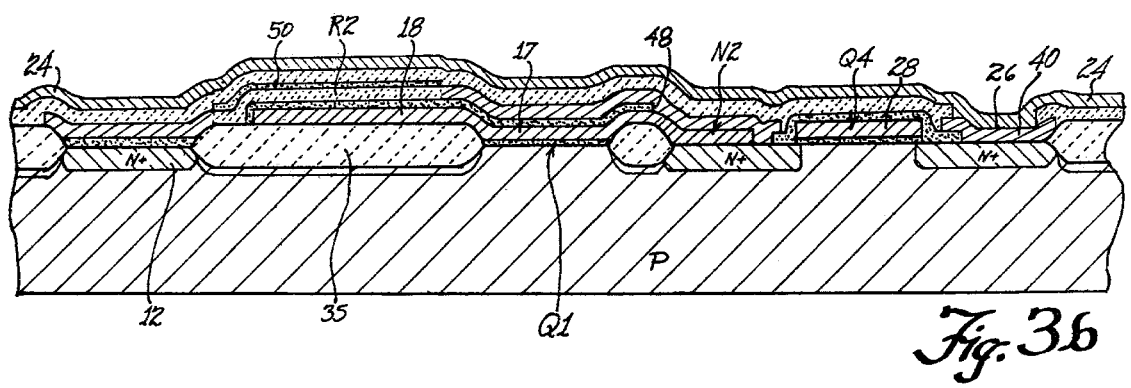
Figure 3C:
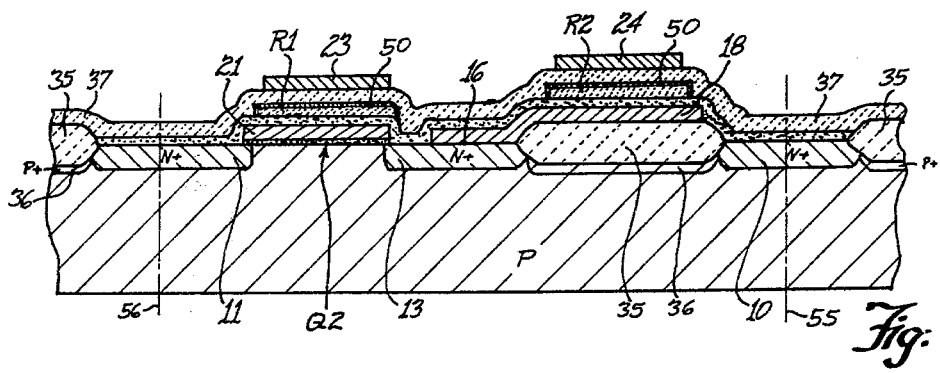
Figure 3D:
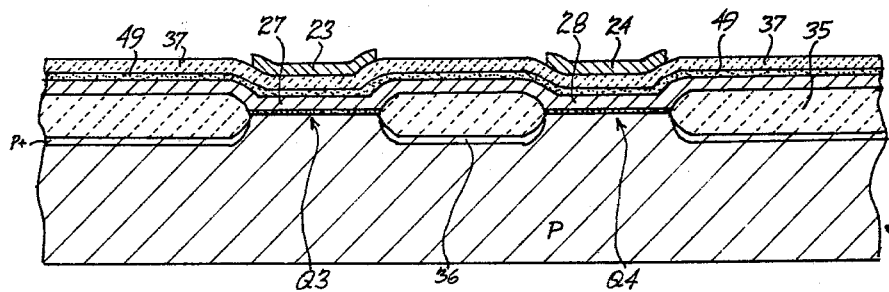

As seen in FIGS. 3a, 3b and 3c, the resistors R1 and R2, according to a feature of this embodiment, consist of a phosphorus ion implanted portions of second-level polycrystalline silicon strips 38 and 39 which extend from the Vcc line 15. The remainder of the strips 38 and 39 as well as the line 15, except for the resistors R1 and R2, is heavily doped with phosphorus so that it will be highly conductive. The size of the resistor R1 and R2 is about 0.15 mil×0.3 mil in area as seen in plan view of FIG. 1, and about 5,000 Å or 0.5 micron in thickness as seen in a section view as FIGS. 3a–3c. The resistor is seen to overly the first level poly line 20, and indeed overlies the gate 21 of the transistor Q1. This results in a savings in space on the chip which is quite significant. Also, the second level poly in which the resistors are formed does not form the gates of transistors, so it is less critical. The use of second-level poly further allows the Vcc line to overly the Vss line, which conserves additional space. The cell of FIGS. 1–3 is potentially about one-third the size of the static cell using implanted resistors in single level poly as disclosed in application Ser. No. 727,116.

An important feature is that the second level poly (or its underlying thin oxide) does not function as a diffusion mask; the first level poly is that which defines the extent of the N+ diffusions in the moats by means of the thin oxide 34 which is the diffusion mask. Therefore, the second level poly lines can cross over moats without creating transistors. In prior art double-level poly processes, such as shown in applications Ser. No. 648,594, filed Jan. 12, 1976 by C-K Kuo, or Ser. No. 754,144, filed Dec. 27, 1976 by L. S. Wall, the second-level poly is used to define the boundaries of the N+ diffusion, so that neither first nor second level is truly a versatile level of interconnections because these cannot cross over an N+ diffused moat. In the embodiment shown here, four levels of interconnects are available; the only constraint is that first level poly cannot cross an N+ moat.

As will be explained in detail in reference to the process for making the device of FIGS. 1–3, the thickness of the various layers are such that the step which would exist between the metallization level and the moat level is perhaps 10,000 to 15,000 Å. This is inconsistent with acceptable yields. A step of this magnitude can produce discontinuities in the metal at the edges of a metal-to-moat contact. It is for this reason that a discrete area 40 of second-level polycrystalline silicon is positioned in the contact area 25 or 26 so that the step will be reduced by about 5000 Å and yields increased. Heretofore, metal-to-moat contacts have been avoided, particularly in double-level poly structures.

The resistors R1 and R2 function as field-effect transistors because the resistance of these elements is dependent upon the voltage on the first level poly 18 and 20, i.e., the voltage on the nodes N1 and N2, assuming that the oxide layers 41 between first and second level poly is thin. This oxide may be about 3000 Å in one example. The magnitude of each of the resistors R1 and R2 is about 500 K ohm or more when a "0" is stored on the corresponding node N1 and N2, but switches to about 30% or less of its higher value when a "1" is stored, assuming the "1" level to be +5 v. and the "0" level to be ground or Vss. This is in addition to the influence of the "source" voltage; the resistance will also change as a function of the voltage across it as explained in application Ser. No. 727,116. The more positive the voltage on the gate 21 in FIG. 3a, the lower the magnitude of the resistor R1. This functions to reduce power consumption in a large array of static cells; each cell will have one transistor on and one off, storing a "1" or "0", and the on transistor will have a high resistance in series with it to minimize power drain while the off transistor will have a low resistance in series so it will provide almost a full logic level voltage on the gate of the opposite transistor and almost a full logic level (minus a Vt drop for Q3 or Q4) to the output lines 23 or 24 if the cell is addressed. The node N1 or N2 which is to be a "1" will charge to almost Vcc through the low resistance. Current dissipation, assuming the resistors R1 and R2 are 1 megohm, is 1 microamp per cell, or 16 milliamp for a 16K array; power dissipation would be 80 milliwatts. Resistors R1 and R2 can be increased to values exceeding 20 megohm.

Figure 4A:
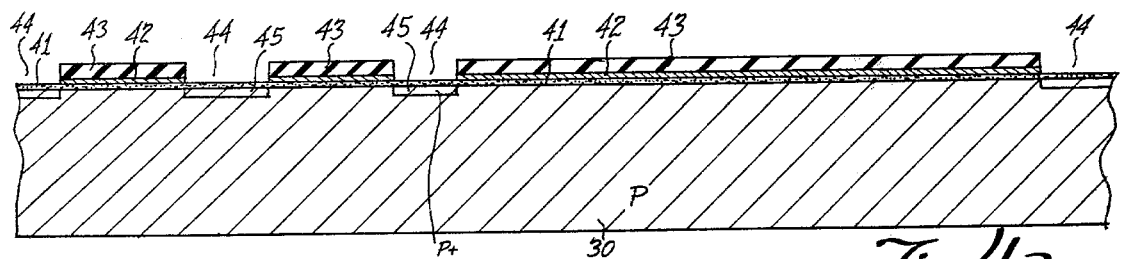
FIGS. 4a–4e are elevation views in section of the semiconductor device of FIGS. 1 and 3a, at successive states in the manufacturing process, taken along the line a—a in FIG. 1.

Referring now to FIGS. 4a–4e, a process for making the N-channel, silicon-gate, self-aligned, double-level poly, MOS integrated circuit device of FIGS. 1 and 3a–3d will be described. The starting material is a slice of P-type monocrystalline silicone, perhaps 3 inches in diameter and 20 mils thick, cut on the <100> plane, of a resistivity of about 6 to 8 ohm-cm. In FIGS. 3a or 4a, a wafer or body 30 represents a very small part of the slice, of about 1.5 mil in lateral dimension, chosen as a representative sample cross section. First, after appropriate cleaning, the slice is oxidized by exposing to oxygen in a furnace at an elevated temperature of perhaps 1000° C. to produce an oxide layer 41 of a thickness of about 1000 Å. Next a layer 42 of silicon nitride Si₃N₄ about 1000 Å thick is formed by exposing to an atmosphere of silane and ammonia in an rf reactor. A coating 43 of photoresist is applied to the entire top surface, then exposed to ultraviolet light through a mask which defines the desired pattern, and developed, leaving areas 44 where nitride is to by etched away and field oxide 35 is to be grown. Alternatively, smaller geometries and thus smaller cell sizes may be obtained by using electron beam lithography in place of uV light and glass masks to expose the photoresist, as disclosed in Bell Laboratories Record, March 1976, p. 69–72 and Electronic Products, February 1977, p. 17. The slice is subjected to a plasma ethch, which removes the part of the nitride layer 42 not covered by the exposed photoresist 43, but does not remove the oxide layer 41 and does not react with the photoresist 43.

The slice is next subjected to an ion implant step, whereby boron atoms are implanted in the areas 44 of silicon not covered by photoresist 43 and nitride 42. The photoresist is left in place as an implant mask. Boron is an impurity which produces P-type conductivity, so more heavily doped P+ regions 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer 43 is removed.

As will be seen, the regions 45 do not exist in the same form in the finished device, because some of this part of the slice will have been consumed in the oxidation procedure. The implanted regions 45 will ultimately produce the P+ channel stop regions 36.

As set forth in patent application Ser. No. 684,593, filed Jan. 12, 1975 by G. R. Mohan Rao, assigned to Texas Instruments, the next step in the process is to subject the slice to a heat treatment or annealling step, during which the slice is maintained at a temperature of about 1000° C. for about 2 hours in an inert atmosphere, preferably nitrogen. This step causes the boron concentration to change markedly, which has desirable effects aside from reduction in bulk damage in the crystal structure. The P+ regions 45 penetrate deeper into the silicon surface during this anneal step.

Figure 4B:
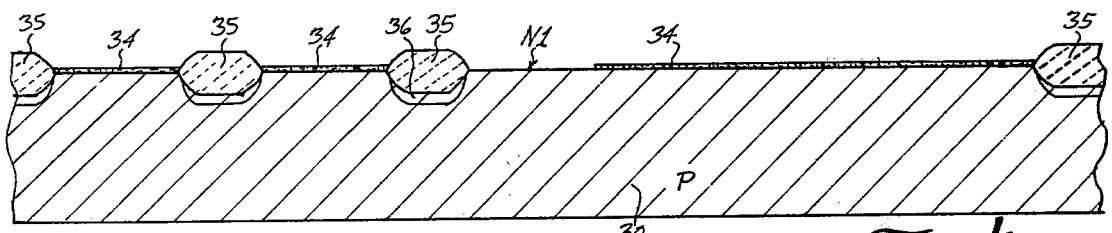

The following step is formation of field oxide, which is done by subjecting the slices to steam or an oxidizing atmosphere at about 950° C. for perhaps 10 hours. As seen in FIG. 4b, this causes a thick field oxide region or layer 35 to be grown, and this region extends into the silicon surface because silicon is consumed as it oxidizes. The nitride layer 42 masks oxidation beneath it. The thickness of this layer 35 is about 8000 to 10,000 Å, half of which is above the original surface and half below. The boron doped P+ region 45 as previously implanted and modified by the anneal step will be partly consumed, but will also diffuse further into the silicon ahead of the oxidation front. Thus, the P+ regions 36 will result which will be deeper and of more uniform and acceptable concentration at the surface compared to what would have resulted without the anneal step. Also, the regions 36 will not have the extent of crystalline structure damage characteristic of implanted devices.

The nitride layer 42 and its underlying oxide layer 41 are removed by etching, as the next step, and another thin silicon oxide layer 34 of about 800 Å is grown over the exposed areas of silicon.

At this time, although not reflected in the FIGURES, two ion implant steps can be performed to create the desired threshold or operating parameters in transistors in the integrated circuit. First, boron is implanted in all moat areas at 50 KeV to a dosage of about $2.5 \times 10^{11}$ atoms per $cm^2$ for the purpose of adjusting the threshold voltage of thin oxide enhancement mode transistors so that substrate bias voltage will not be needed. Then, a photoresist layer is applied and patterned to expose the channel areas of depletion load transistors in peripheral circuitry, not in the cell array. These areas are then subjected to a phosphorus implant at 150 KeV with a dosage of about $1 \times 10^{12}$ per $cm^2$. This phosphorus implant is selected to produce high speed devices in the peripheral circuits. As explained in application Ser. No. 727,116, if depletion load transistors had been used in place of the resistors R1 and R2 in the cell array then attaining low standby power dissipation would have been the most important factor rather than speed in the peripheral circuits and so speed in terms of access time would be compromised. In addition, of course, the use of resistors R1 and R2 in second-level poly reduces the cell size.

Figure 4C:
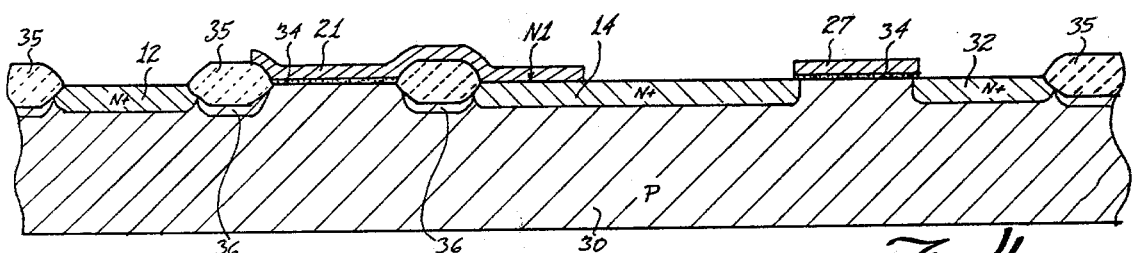

Windows 46 for first level polysilicon to moat contacts are patterned and etched using photoresist removing the gate oxide layer 34 in selected areas such as the contact areas at the nodes N1 and N2. Next, a layer of polycrystalline silicon is deposited over the entire slice in a reactor using standard techniques, for example by decomposition of silane in hydrogen at about 930° C. to a thickness of 0.4 to 0.6 micron, producing the first-level polysilicon which is then patterned to form the strips 18 and 20, and the line 29, using photoresist. The resulting structure is seen in FIG. 4c. At the same time using the photoresist which patterns the first level poly, the thin oxide 34 is removed in all exposed areas, leaving oxide only in the transistor gate areas (plus capacitor areas, not shown, which may be needed in peripheral circuitry, as in boot-strap circuits).

Using the remaining first level polysilicon coating and thin oxide 34, as well as the field oxide, as a diffusion mask, the slice is now subjected to an N+ diffusion. Phosphorus is deposited and then diffused into the silicon slice 30 to produce all of the N+ regions 11, 12, 13, 14, 32, 33, etc. The depth of diffusion is about 8000 to 10,000 Å. The N+ diffused regions function as conductors which connect the various regions together, and also function as the source or drain regions of all the transistors. This diffusion renders highly conductive all of the exposed polysilicon areas such as gates 17 and 21, the strips 18 and 20, the line 29, etc. In the poly-to-moat contact areas N1 and N2, the N+ diffusion penetrates the poly and converts the underlying P-type silicon to N+ because here the oxide layer 34 has been removed. The masks used to define these contact areas when the oxide coating 34 was removed are shown in FIG. 1 as dotted lines 47 and 48. These are much larger than the actual contact areas to allow substantial misalignment.

Oxide is grown over the first level poly by thermal oxidation to produce a layer 49 of about 2000 to 3000 Å thickness. At this same time, the exposed silicon in the moat areas is oxidized so the layer 49 extends over the N+ regions 10, 11, 12, 13, 14, 32, 33, etc. If the transistor effect in the resistors R1 and R2 is to be utilized, the oxide layer 49 may be thinner, perhaps 1000 Å, although this is at the expense of yield. The oxide may be made thin only under the resistors by growing about 2000 Å, patterning the oxide using photoresist to remove that where the resistors R1 and R2 are to be, then growing 1000 Å. In this manner the thin oxide area of the chip can be held to a minimum; the total thin oxide area is one of the primary factors influencing yield.

Figure 4D:
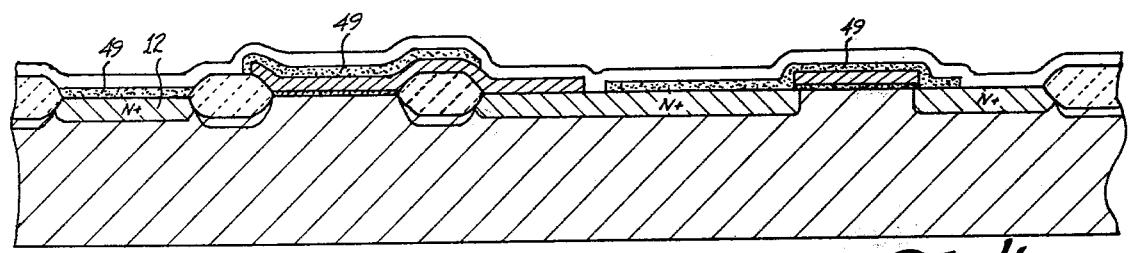

As seen in FIG. 4d, the oxide layer 49 is patterned using photoresist to open the contact areas 25 and 26 and the contact areas at the nodes N1 and N2, that is, all second-poly to first-poly or second-poly-to-moat contact areas.

The second level of polycrystalline silicon is now deposited using a method as for the first level, providing a thickness of about 0.5 micron.

The entire second-level polycrystalline silicon coating is now subjected to a phosphorus implantation which creates the characteristics of the resistors R1 and R2. Areas of polysilicon which are to be highly conductive will be later subjected to a phosphorus diffusion which will leave them heavily doped. To define the resistor characteristics, this implant step is performed at 100 to 150 KeV to a dosage of from $5 \times 10^{13}$ to $1 \times 10^{14}$ phosphorus atoms per cm$^2$, depending upon the desired sheet resistivity for the resistors. Following this phosphorus implant for the resistors, the slices are annealled in an N$_2$ atmosphere for 30 minutes at 1000° C.; this is for the purpose of distributing the phosphorus properly in the polysilicon.

As reported by Bean et al, Journal of Applied Physics, Vol. 40, No. 5, pp. 2358-2359, April 1969, the resistivity of polycrystalline silicon is $5 \times 10^5$ ohm-cm with an apparent P-type concentration of $2.1 \times 10^{11}$ to $5.8 \times 10^{11}$/cm$^3$, and a mobility of 33 to 430 cm$^2$/volt-sec. In polysilicon as the thickness is decreased to less than one micron, the conduction will be along grain boundaries, so resistivity in such case will be at least as high as $10^5$ ohm-cm. The sheet resistance in such case will be [Rs]×[1/d] or $10^5 \times 1(0.5 \times 10^{-4})$ which is approximately $2 \times 10^8$ ohm per square. This would be too unstable with temperature and too highly resistive. The phosphorus implant serves to produce a resistivity of ideally about one to five megohms per square at 25° C. Lower resistivity results in too large cell size, and higher results in instability, non-reproducibility and excessive voltage dependence.

Figure 4E:
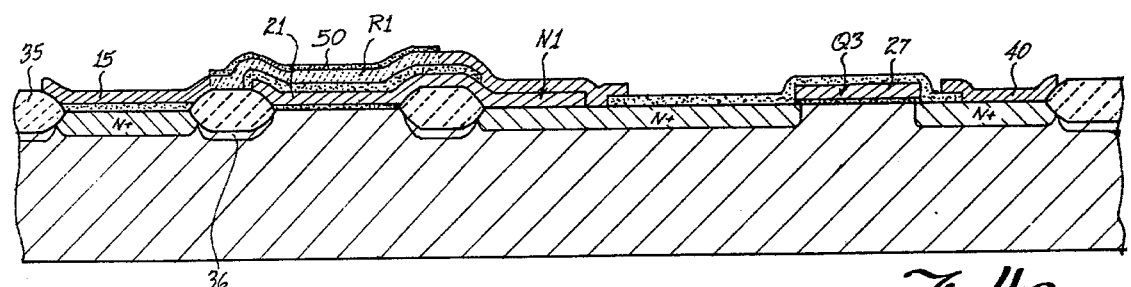

The second level-polysilicon coating is next patterned. This is done by applying a layer of photoresist, exposing to ultraviolet light through a mask prepared for this purpose, developing, then etching with the remaining photoresist masking certain areas of the polysilicon. The resulting structure is seen in FIG. 4e, where a part of the remaining polysilicon layer provides what will be the Vcc line 15 and the extensions 38 and 39 thereof which will have the resistors R1 and R2 and the contacts at the nodes N1 and N2. Also, the discrete areas 40 which reduce the step in a metal-to-moat contact are left in place by this patterning operation. In contrast to the prior application Ser. No. 727,116, no transistor gates are created by this layer of polycrystalline silicon, and indeed it overlies transistor gates.

After patterning the second level polysilicon a protective cap of silicon dioxide is grown on the polysilicon, producing a coating 50 on all exposed surfaces of the poly, including tops and sides. The coating 50 is grown at about 900° C. in steam for about two hours, producing approximately 3000Å thickness and consuming part of the polysilicon. The function of the cap is to prevent deposition of impurities on the resistors or diffusion into the resistors. A photoresist masking and etching operation is then used to remove the coating 50 on all areas of polysilicon except over the resistors R1 and R2. The masks used to define the ocide left to protect the resistor is seen in FIG. 1 defined by dotted lines 51 and 52; these are much wider than the resistors, functioning to permit rather wide margin for error in mask alignment. The masked second-level poly is then subjected to a phosphorus deposition and diffusion, rendering the areas not covered by the oxide 50 highly conductive.

As seen in FIG. 3a, fabrication of the device is continued by depositing a thick layer 37 of phosphorus-doped oxide. Rather than by oxidizing, this is done by a low temperature reaction process using conventional chemical vapor deposition techniques. A layer 37 of about 10,000Å is produced, covering the entire slice. This deposition is followed by a "densification" step wherein the slice is heated at 950° C. for the purpose of eliminating minute holes or pores in the oxide. Subsequently, a photoresist operation opens windows in the oxide layer 37 in areas 25 and 26 where contact is to be made from metal to the second-level polysilicon discrete areas 40 and thus to the moat areas 32 and 33. The step is much less than if the discrete areas 40 were not in place. Although not shown in the FIGS., at this same time openings are made in the thick oxide 37 where metal to first poly contacts are needed, as in peripheral circuits, though not in the array; for these metal-to-poly contacts a discrete area of second level poly such as the area 40 would also be left in place to reduce the step. Then, a layer of aluminum is deposited on the entire slice, and selectively etched using photoresist masking to produce the desired pattern of metal strips 23 and 24.

Figure 5:
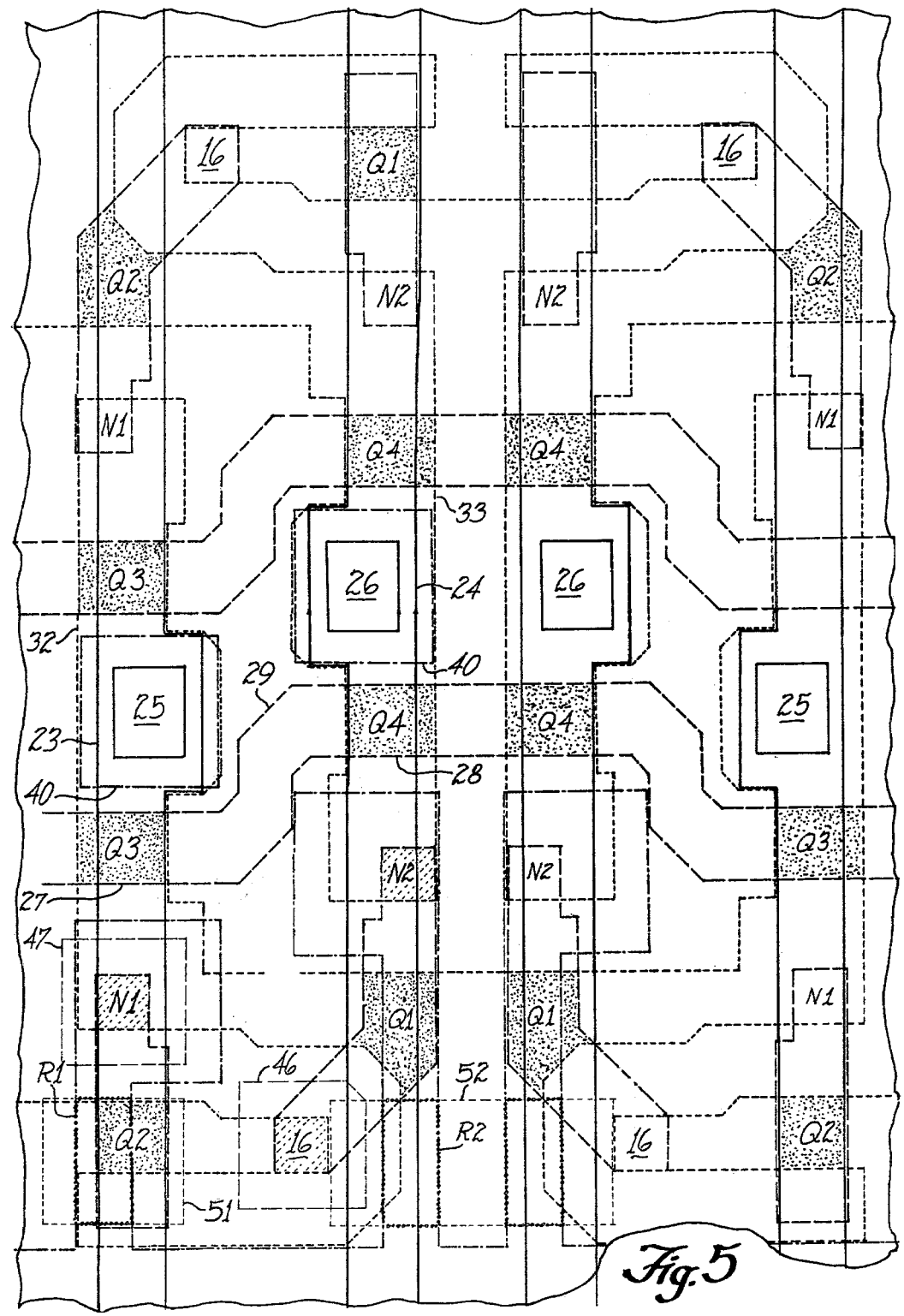
FIG. 5 is a plan view of a layout of the cell of FIG. 1 in an array.

In an array of a large number of the cells of FIG. 1, the layout on the chip would make use of considerable economy of space by mirroring the cell about an axis 55 to define the cell on the right of the one shown, and mirroring the cell about the axis 56 to define the cell on the left. The cell is mirrored about an axis 57 to define the cell below it. So, adjacent cells share the Vcc line 15 and the Vss line 12, as well as the mask holes 51 and 52 and edges of the moat areas 10 and 11. The contacts 25 and 26 are staggered and the cell reversed and mirrored about an axis 58, producing the layout of FIG. 5 in an array, so the contacts 25 and 26 are shared with the adjacent cell above the axis 58 of FIG. 1. The moats form complex continuous figures shared by entire columns of cells, rather than discrete moat areas. An array of $2^{14}$ or 16384 cells would contain 128 rows and 128 columns of cells, but would require only sixty-four of the N+ diffused moat Vss lines 12 and sixty-four poly Vcc lines 15. 8192 sets of the contacts 25 and 26 would be needed, as they are shared.

It is noted that the process and structure described in this embodiment provides a completely versatile contact and interconnect arrangement. In contrast to prior double-level poly or other like processes, contacts may be made from metal to second poly, metal to first poly, metal to moat (via discrete areas 40 of second poly), second poly to first poly, second poly to moat, or first poly to moat.

Other resistors such as the resistors R1 and R2 can be formed in the first level poly as described in the application Ser. No. 727,116, so resistors would be in both levels. Also, the transistor action of the resistors R1 and R2 would exist in the embodiment where resistors were in the first level poly; the second level poly would then function as the gate.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An N-channel, silicon-gate MOS integrated circuit of the type having field oxide surrounding transistor areas of the face of a semiconductor substrate and a first level of polycrystalline silicon extending across the field oxide and contacting at least one of the transistor areas, the first level providing gates for the transistors, comprising:
    (a) a second level of polycrystalline silicon at least partially overlying the first level on said face but insulated therefrom,
    (b) a resistor region in the second level implanted with conductivity determining impurity,
    (c) conductive regions in the second level on both ends of the resistor region, the conductive regions being doped at a level much higher than the resistor region.

2. An integrated circuit according to claim 1 wherein the resistor region is implanted with phosphorus at a dosage of about $5 \times 10^{13}$ to $1 \times 10^{14}$ atoms per cm$^2$ at 100 to 150 KeV.

3. An integrated circuit according to claim 2 wherein the polycrystalline silicon is no more than about 0.5 micron in thickness.

4. An integrated circuit according to claim 3 wherein a silicon oxide coating is provided on the resistor region.

5. In a static RAM cell of the type formed in a semiconductor integrated circuit having a semiconductor substrate, a pair of driver transistors formed in the substrate at one face thereof, a pair of load devices, first conductive means at said one face connecting each of the driver transistors in series with one of the load devices, conductive means at said one face cross-coupling an output electrode of each driver transistor to a control electrode of the other driver transistor, a first level of polycrystalline silicon on said one face providing the control electrodes of the transistors, the improvement wherein resistor elements providing said load devices are in a second level of polycrystalline semiconductor material overlying an insulating coating on said one face and at least partly overlying said first level, said second level including first areas providing the resistor elements and second areas providing conductors, the second areas being more heavily doped with conductivity-determining impurity than the first areas.

6. A device according to claim 5 wherein the resistor elements are phosphorus implanted.

7. A device according to claim 5 wherein the substrate is silicon and the driver transistors are surrounded on said one face by thermally-grown silicon oxide.

8. A device according to claim 7 wherein the first conductive means and the second conductive means include portions of the first level of polycrystalline silicon which is heavily doped with phosphorus.

9. A device according to claim 5 wherein the second conductive means includes elongated strips of silicon each of which extends from the control electrode of one driver transistor to an output electrode of the other driver transistor, and each of which at least partially underlies the second level of polycrystalline silicon.

10. A device according to claim 5 wherein the driver transistors are N-channel silicon-gate MOS transistors.

11. A device according to claim 10 wherein the resistor elements are no greater than about 0.5 micron in thickness.

12. A device according to claim 11 wherein the resistor elements have an impurity concentration corresponding to an implant dosage of at least $5 \times 10^{13}$ atoms per cm$^2$ and not more than about $10^{14}$ atoms per cm$^2$ at an energy level of at least about 100 KeV and not over about 150 KeV.

13. A device according to claim 5 wherein a thin silicon oxide protective coating is provided over the polycrystalline silicon of the resistor elements.

14. A device according to claim 10 wherein the transistors are formed in one continuous moat along with at least one data-input transistor said moat being a surface area of said silicon substrate, such surface area being surrounded by said thermally-grown silicon oxide and being at a level below that of the top of such oxide.

15. A device according to claim 14 wherein the continuous moat forms an elongated figure which additionally includes at least one data-input transistor for an adjacent cell and is integral with a supply line for a reference potential.

16. A device according to claim 15 wherein said second level of polycrystalline silicon is an elongated continuous strip having extensions which provide the resistor elements and the conductors for a plurality of different adjacent cells.

* * * * *